(12) United States Patent
Sheu et al.

(10) Patent No.: US 7,889,547 B2
(45) Date of Patent: Feb. 15, 2011

(54) MEMORY AND WRITING METHOD THEREOF

(75) Inventors: Shyh-Shyuan Sheu, Taichung (TW); Lieh-Chiu Lin, Kaoshiung (TW); Pei-Chia Chiang, Taipei (TW); Wen-Pin Lin, Dacun Township (TW)

(73) Assignee: Industrial Technology Research Institute, Hsinchu (TW)

( * ) Notice: Subject to any disclaimer, the term of this patent is extended or adjusted under 35 U.S.C. 154(b) by 173 days.

(21) Appl. No.: 12/344,709

(22) Filed: Dec. 29, 2008

(65) Prior Publication Data

US 2009/0296450 A1 Dec. 3, 2009

(30) Foreign Application Priority Data

Jun. 2, 2008 (TW) .............................. 97120428 A

(51) Int. Cl.
*G11C 11/00* (2006.01)
(52) U.S. Cl. ............ 365/163; 365/189.15; 365/189.16; 365/230.06; 365/204
(58) Field of Classification Search .................. 365/163, 365/189.16, 189.05, 230.06, 204, 189.15
See application file for complete search history.

(56) References Cited

U.S. PATENT DOCUMENTS

| 7,075,841 B2 * | 7/2006 | Resta et al. ............ 365/189.16 |
| 7,085,154 B2 | 8/2006 | Cho |
| 7,102,948 B2 * | 9/2006 | Perner ........................ 365/209 |
| 2005/0068804 A1 | 3/2005 | Choi |

* cited by examiner

*Primary Examiner*—Son Dinh
(74) *Attorney, Agent, or Firm*—Wang Law Firm; Li K. Wang

(57) ABSTRACT

A memory having a memory cell, a resistance estimator and a write current generator. The resistance estimator is coupled to the memory cell to estimate the resistance of the memory cell and outputs an estimated resistance level. According to the estimated resistance level, the write current generator generates a write current to flow through the memory cell and to change the resistance of the memory cell. The write current is in a pulse form, and the write current generator sets the pulse width, or magnitude, or both the pulse width and the magnitude of the write current according to the estimated resistance level.

17 Claims, 11 Drawing Sheets

MEMORY AND WRITING METHOD THEREOF

CROSS REFERENCE TO RELATED APPLICATIONS

This Application claims priority of Taiwan Patent Application No. 097120428, filed on Jun. 2, 2008, the entirety of which is incorporated by reference herein.

BACKGROUND OF THE INVENTION

1. Field of the Invention

The present invention relates to memories, and in particular relates to writing methods thereof.

2. Description of the Related Art

Memories, such as a phase change memory (PCM) or magnetoresistance random memory (MRAM), use memory cells having controllable resistance. The resistances of these kinds of memory cells are dependent on a current pulse (thereinafter named "write current") flowing therethrough. The memory cell stores different digital values by different resistances.

This paragraph recites the physical properties of a phase change memory cell. By controlling magnitude and pulse width of the write current flowing through the phase change memory cell, the phase change memory cell is switched between a crystalline state and an amorphous state. A phase change memory cell in the amorphous state (aka "reset mode") has a greater resistance than that in the crystalline state (aka "set mode"). Conventional techniques usually use the high resistance to represent digital data '1' and the low resistance to represent digital data '0'. When considering a write current for an amorphous state versus a crystalline state, the write current for the amorphous state requires a greater magnitude and a shorter pulse width.

The transformation between the amorphous state and the crystalline state may be incomplete. In US Patent Publication No. US2005/0068804A1, a solution for an incomplete amorphous transformation is disclosed. This conventional technique initially provides the phase change memory cell with a write current and then verifies the resistance of the phase change memory cell. When the verification result shows that the phase change memory cell has not completely transformed to the amorphous state, the magnitude of the write current is increased. The verification and increasing write current procedure are repeated until the verification result shows that the phase change memory cell has been completely transformed to the amorphous state.

The technique of US Patent Publication No. US2005/0068804A1, however, is limited to incomplete transformation from a crystalline state to an amorphous state and not vice versa. Because the write current for the crystalline state is lower than that for the amorphous state, using the increasing write current procedure disclosed in US Patent Publication No. US2005/0068804A1 for an incomplete crystalline state may overly increase the write current, wherein the phase change memory cell may be reversed back to the amorphous state. Thus, memories with complete amorphous and crystalline transforming capabilities are called for.

BRIEF SUMMARY OF THE INVENTION

The memory disclosed in this application comprises a memory cell, a resistance estimator and a write current generator. The resistance estimator is coupled to the memory cell to estimate the resistance of the memory cell and outputs an estimated resistance level. According to the estimated resistance level, the write current generator generates a write current to flow through the memory cell and to change the resistance of the memory cell. The write current is in a pulse form, and the write current generator sets the pulse width, or magnitude, or both the pulse width and the magnitude according to the estimated resistance level.

In an exemplary embodiment wherein both the pulse width and the magnitude of the write current are dependent on the estimated resistance level, the write current generator includes: a magnitude controller, a pulse width controller and a pulse width setting switch. According to the estimated resistance level, the magnitude controller generates an action current to determine the magnitude of the write current, and the pulse width controller outputs a pulse signal to determine the pulse width of the write current. The pulse width setting switch is coupled between the magnitude controller and the memory cell, and is controlled by the pulse signal generated by the pulse width controller. Thus, according to the pulse signal from the pulse width controller, pulse width setting switch conducts the action current into the memory cell as the write current.

The invention further discloses writing methods for memories. An exemplary embodiment of the writing method includes the following steps: estimating resistance of a memory cell of a memory to generate an estimated resistance level; setting pulse width, or magnitude, or both the pulse width and the magnitude of a write current according to the estimated resistance level; and generating the write current to flow through the memory cell to change the resistance of the memory cell.

The memory cell of the invention may be realized by a phase change memory cell and the invention achieves complete amorphous or crystalline transformation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description introduces several exemplary embodiments carrying out the invention. This description is made for the purpose of illustrating the general principles of the invention and should not be taken in a limiting sense. The scope of the invention is best determined by reference to the appended claims.

Figure 1:
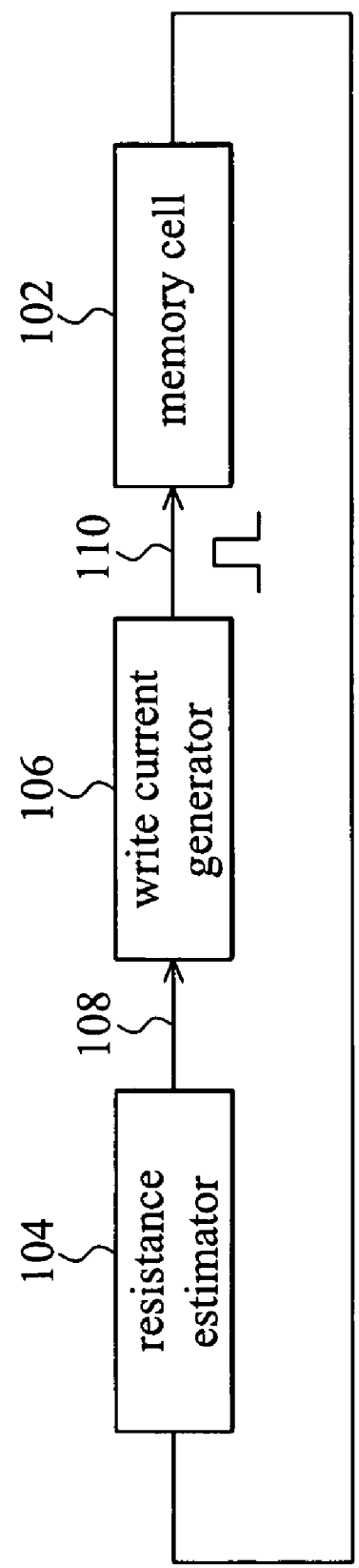
FIG. 1 is a block diagram, depicting an exemplary embodiment of the memories of the invention.

FIG. 1 is a block diagram, depicting an exemplary embodiment of the memories of the invention. The memory of the invention includes a memory cell 102, a resistance estimator 104 and a write current generator 106. The resistance estimator 104 is coupled to the memory cell 102 to estimate the resistance of the memory cell 102 and to output an estimated resistance level 108. According to the estimated resistance level 108, the write current generator 106 generates a write current 110 to flow through the memory cell 102 to change the resistance of the memory cell 102. The write current 110 is in a pulse form. The write current generator 106 sets the pulse width of the write current 110 according to the estimated resistance level 108.

Figure 2:
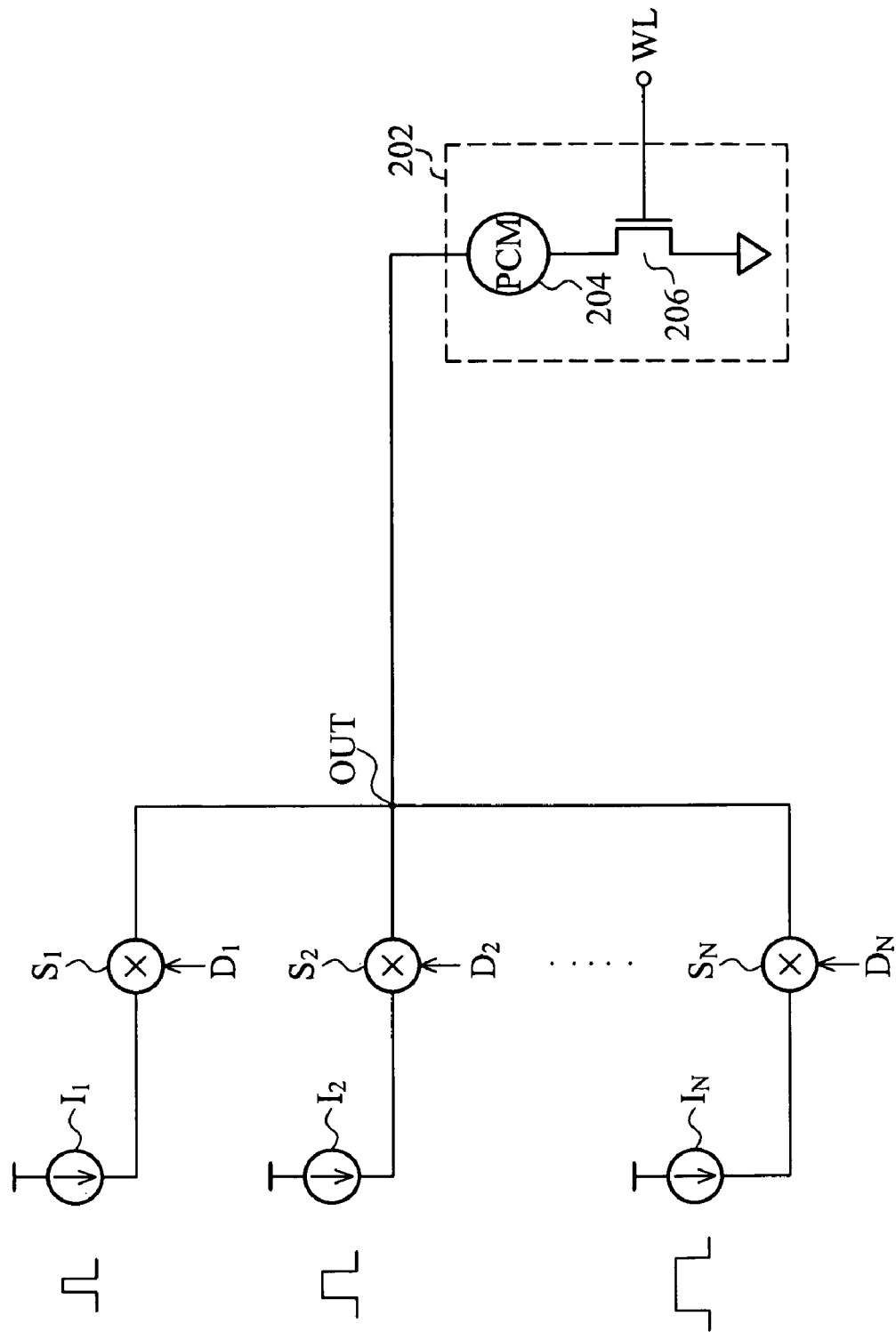
FIG. 2 depicts an exemplary embodiment of the write current generator 106 of the invention.

FIG. 2 depicts an exemplary embodiment of the write current generator 106 of the invention, which includes a plurality of current generators $I_1$-$I_N$, a plurality of switches $S_1$-$S_N$, and a decoder providing switch control signals $D_1$-$D_N$ for the switches $S_1$-$S_N$. The current generators $I_1$-$I_N$ generate a plurality of current pulses, respectively, wherein the current pulses are of distinct pulse widths. The switches $S_1$-$S_N$ have a one-to-one relationship with the current generators $I_1$-$I_N$, and are operable to couple the current generators $I_1$-$I_N$ to the output terminal OUT of the write current generator. According to the estimated resistance level (signal 108 of FIG. 1), the decoder generates the switch control signals $D_1$-$D_N$ to conduct an appropriate current generator (one of the current generators $I_1$-$I_N$) to the output terminal OUT. Thus, an appropriate current pulse is provided to the memory cell 202.

In the exemplary embodiment shown in FIG. 2, the memory cell 202 is realized by a PCM cell, and includes a phase change storage element 204 and a switch 206 controlled by a word line signal WL. The memory cell is not limited to the PCM cell 202 and may be realized by any other memory cell with current-controlled resistance.

Figure 3:
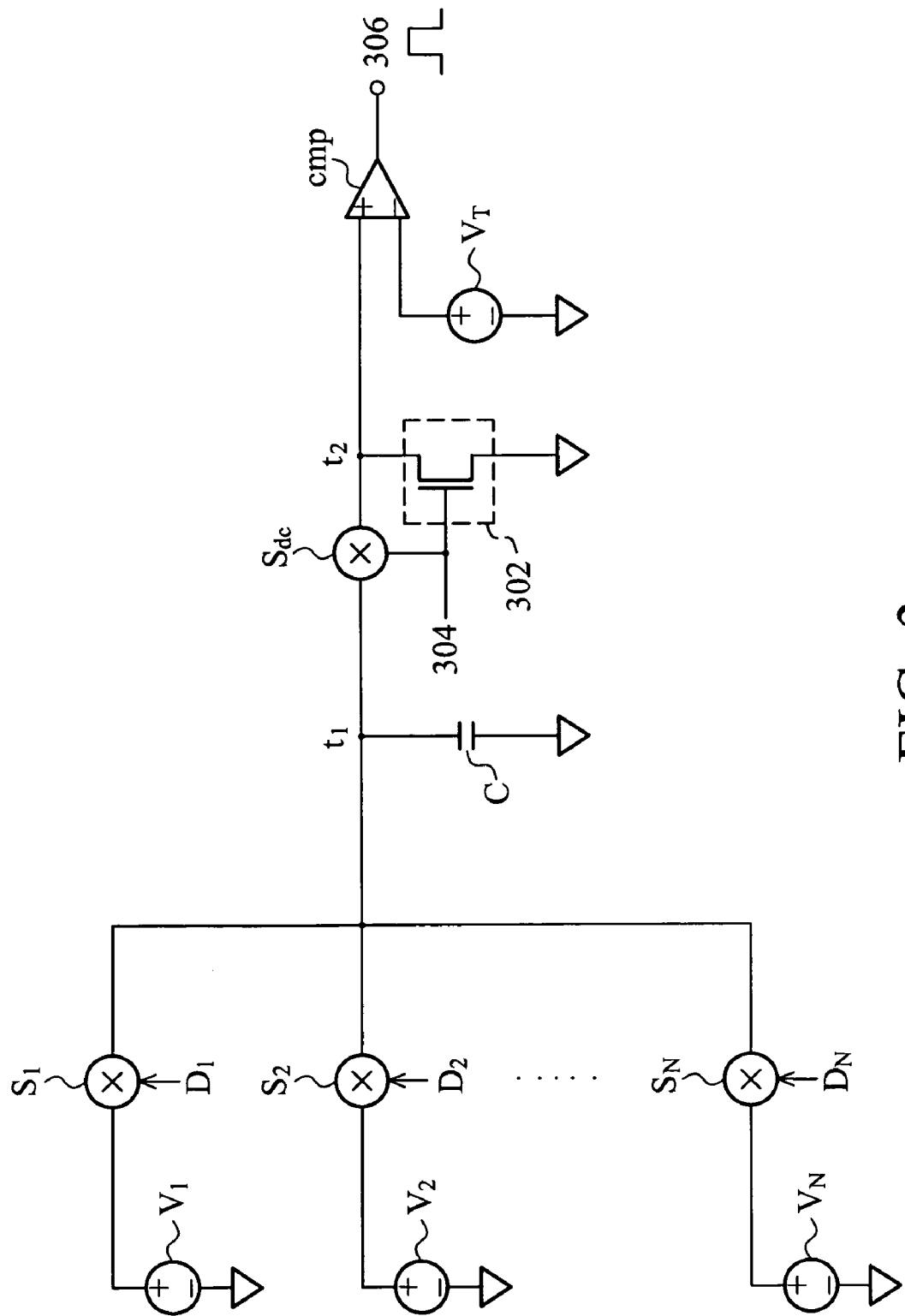
FIG. 3 depicts another exemplary embodiment of the write current generator 106 of the invention.
Figure 4:
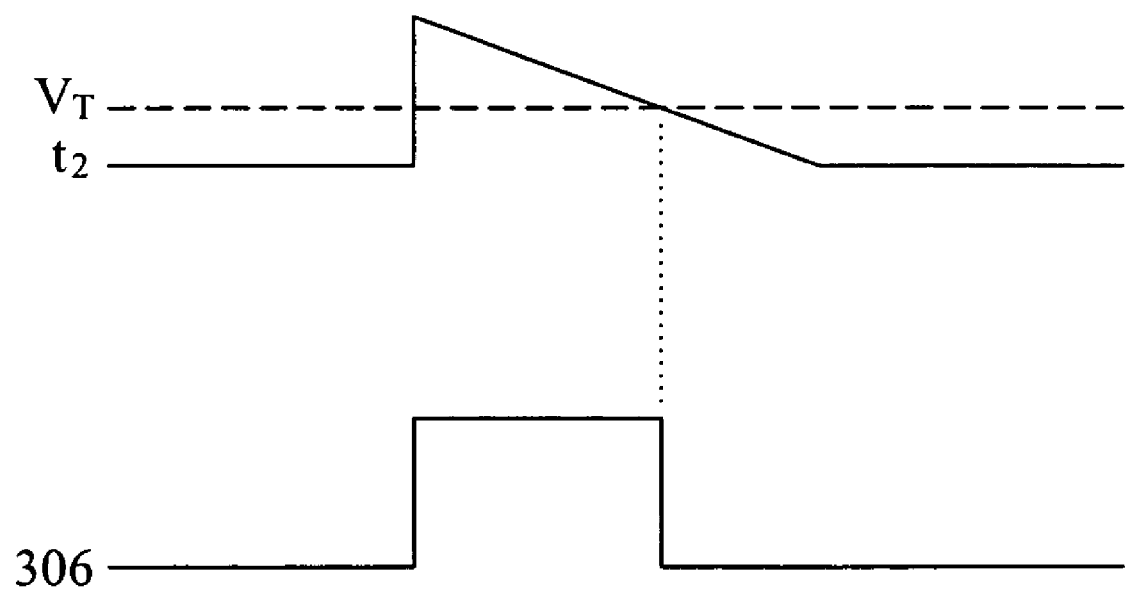
FIG. 4 shows exemplary waveforms of a signal on the second node $t_2$, the reference voltage $V_T$ and the pulse signal 306 of FIG. 3.

FIG. 3 depicts another exemplary embodiment of the write current generator 106 of the invention, which includes a plurality of voltage generators $V_1$-$V_N$, a plurality of switches $S_1$-$S_N$, a capacitor C, a discharging element 302, a discharging switch $S_{dc}$, a comparator cmp, and a decoder providing switch control signals $D_1$-$D_N$ for the switches $S_1$-$S_N$. The voltage generators $V_1$-$V_N$ generate a plurality of voltage signals, respectively. These voltage signals are of different voltage levels. As shown in FIG. 3, the capacitor C is coupled between a first node $t_1$ and the ground. The write current generator shown in FIG. 3 may be operated under a charge mode or a discharge mode for charging or discharging the capacitor C. In the charge mode, the decoder outputs the switch control signals $D_1$-$D_N$ according to the estimated resistance level (signal 108 of FIG. 1), and an appropriate switch is conducted to charge the capacitor C by an appropriate voltage generator. The components designed for the discharge mode include the discharging element 302 and the discharging switch $S_{dc}$. The discharging element 302 is coupled between a second node $t_2$ and the ground. The discharging switch $S_{dc}$ is coupled between the first and second nodes $t_1$ and $t_2$. In the discharge mode, the discharging switch $S_{dc}$ and the discharging element 302 are conducted by a signal 304 to provide the capacitor C with a discharge path. The second node $t_2$ is further coupled to the comparator cmp to be compared with a reference voltage $V_T$. The output of the comparator cmp is a pulse signal 306. The pulse signal 306 determines the pulse width of the write current (110 of FIG. 1). Exemplary waveforms of a signal on the second node $t_2$, the reference voltage $V_T$ and the pulse signal 306 are shown in FIG. 4. When the write current generator enters the discharge mode, the signal on the second node $t_2$ jumps to the voltage level stored in the capacitor C, and the pulse signal 306 rises. As the capacitor C is discharged the signal on the second node $t_2$ gradually falls down. When the signal on the second node $t_2$ is lower than the reference voltage $V_T$, the pulse signal 306 drops.

In the embodiment shown in FIG. 3, the discharging element 302 is a transistor, and is controlled by the signal 304. The signal 304 enables the transistor when the write current generator shown in FIG. 3 is in the discharge mode.

Figure 5:
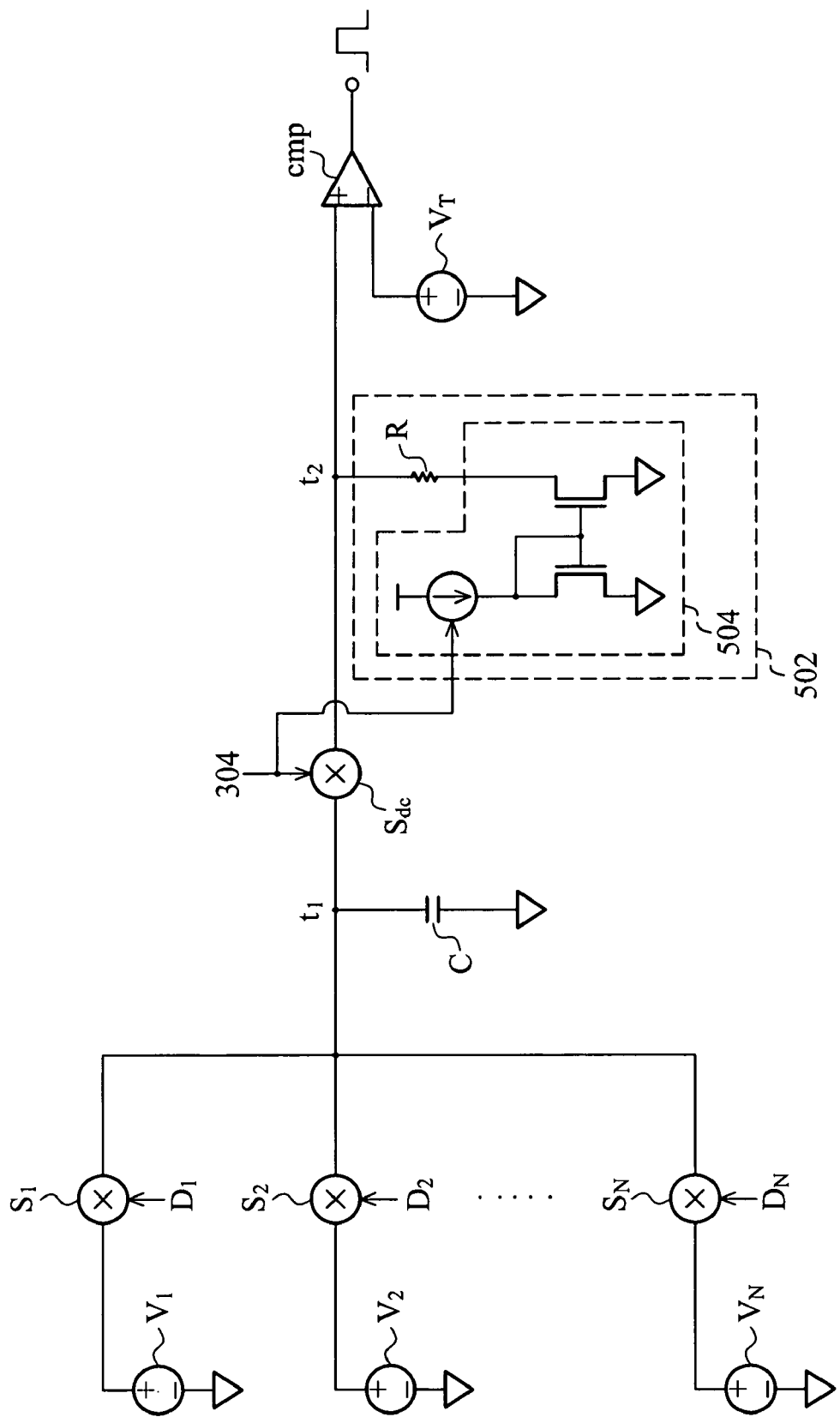
FIG. 5 depicts another exemplary embodiment of the write current generator 106 of the invention.

FIG. 5 depicts another exemplary embodiment of the write current generator 106 of the invention. Compared with the discharging element 302 shown in FIG. 3, the discharging element 502 shown in FIG. 5 includes a current mirror 504 and a resistor R. The current mirror 504, coupled to the second node $t_2$ via the resistor R, provides a discharge current to pull down the voltage level of the second node $t_2$. Compared with the discharging element 302, the discharging element 502 pulls down the voltage level of the second node $t_2$ by a steadier speed. Furthermore, the discharging time of the capacitor C is controllable since the discharge current provided by the current mirror 504 is controllable and can be determined by the user. The discharging time of the capacitor C determines the pulse width of the output signal of the comparator cmp. It should be noted that the resistor R is optional. In other exemplary embodiments, the discharging element may only include the current mirror 504 without the resistor R.

Figure 6:
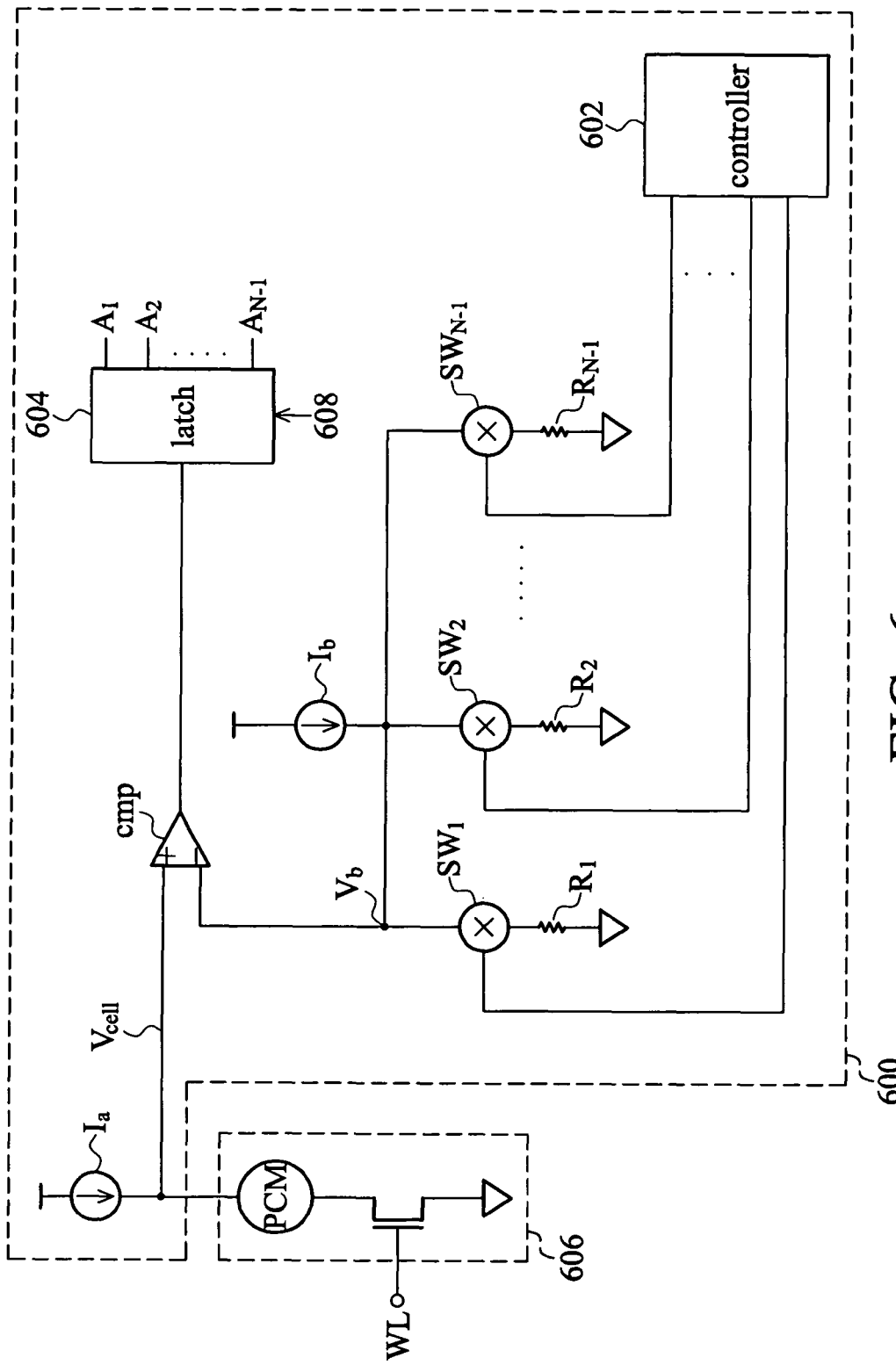
FIG. 6 depicts an exemplary embodiment of the resistance estimator of the invention.

FIG. 6 depicts an exemplary embodiment of the resistance estimator of the invention. The resistance estimator 600 includes a first current generator $I_a$, a second current generator $I_b$, a plurality of resistors $R_1$-$R_{N-1}$, a plurality of switches $SW_1$-$SW_{N-1}$, a control unit 602, a comparator cmp and a latch 604. The first current generator $I_a$ generates a first current to flow through the memory cell 606 to generate a memory cell voltage $V_{cell}$. The second current generator $I_b$ provides a second current to flow through the coupled resistors (selected from resistors $R_1$-$R_{N-1}$) to generate a boundary voltage $V_b$. The comparator cmp compares the memory cell voltage $V_{cell}$ with the boundary voltage $V_b$ and outputs the compared result to the latch 604. The resistors $R_1$-$R_{N-1}$ may be of distinct resistance, wherein the resistance of resistor $R_1$ is smaller than that of resistor $R_2$, the resistance of resistor $R_2$ is smaller than that of that of resistor $R_3$ and so on. The switches $SW_1$-$SW_{N-1}$ have a one-to-one relationship with the resistors $R_1$-$R_{N-1}$, and are operable to selectively couple the second current generator $I_b$ to the resistors $R_1$-$R_{N-1}$. The control unit 602 may conduct the switches $SW_1$-$SW_{N-1}$ separately. For example, the switches $SW_1$-$SW_{N-1}$ may be conducted in a sequence: $SW_1 \rightarrow SW_2 \rightarrow SW_3 \rightarrow \ldots \rightarrow SW_{N-1}$. After all the switches $SW_1$-$SW_{N-1}$ are conducted and the compared results are latched in the latch 604, a trigger signal 608 triggers the latch 604 to output the latched compared results ($A_1$, $A_2$ ... $A_{N-1}$) as the estimated resistance level (signal 108 of FIG. 1). In a case wherein the first and second current generators $I_a$ and $I_b$ provide equivalent currents, the estimated resistance level ($A_1$, $A_2$ ... $A_{N-1}$) is (1, 0 ... 0) when the resistance of the memory cell 606 is between the resistance of the resistors $R_1$ and $R_2$, the estimated resistance level $(A_1, A_2, A_3 \ldots A_{N-1})$ is $(1, 1, 0 \ldots 0)$ when the resistance of the memory cell 606 is between the resistance of the resistors $R_2$ and $R_3$ and so on.

Figure 7:
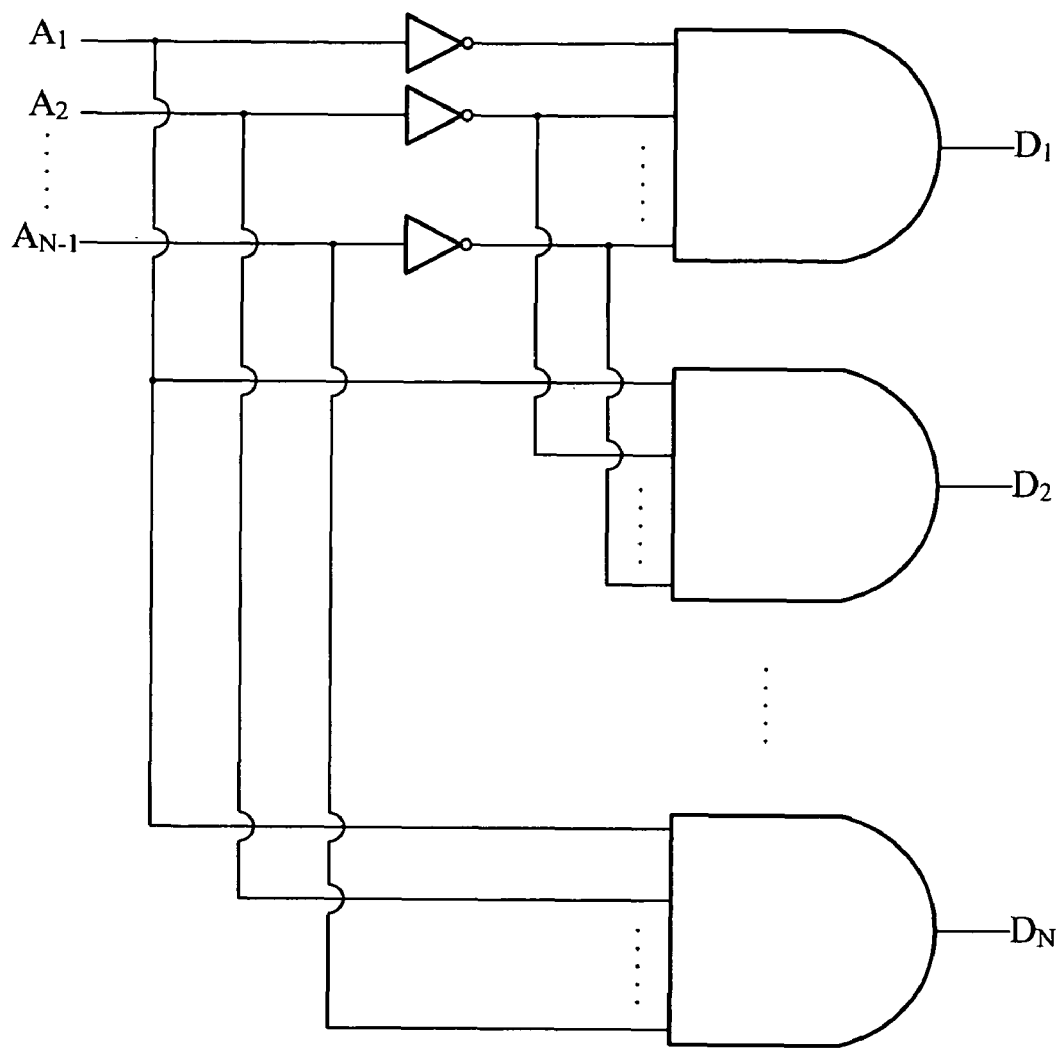
FIG. 7 depicts an exemplary embodiment of the decoder of the invention.

FIG. 7 depicts an exemplary embodiment of the decoder of the invention. The (N–1) resistors $R_1$-$R_{N-1}$ in FIG. 6 provide N levels to label the resistance of the memory cell. The decoder 700 shown in FIG. 7 receives the estimated resistance level $(A_1, A_2 \ldots A_{N-1})$ from the resistance estimator 600 of FIG. 6, and performs a logical operation on the estimated resistance level $(A_1, A_2 \ldots A_{N-1})$ to generate switch control signals $D_1$-$D_N$ controlling switches $S_1$-$S_N$ of FIG. 2, 3 or 5. In a case wherein the first and second current generators $I_a$ and $I_b$ of FIG. 6 provide equivalent current, the control signals $(D_1, D_2, D_3 \ldots D_N)$ is $(0, 1, 0 \ldots 0)$ when the estimated resistance level $(A_1, A_2 \ldots A_{N-1})$ is $(1, 0, 0 \ldots 0)$; it means that the resistance of the memory cell is between the resistance of the resistors $R_1$ and $R_2$.

Figure 8:
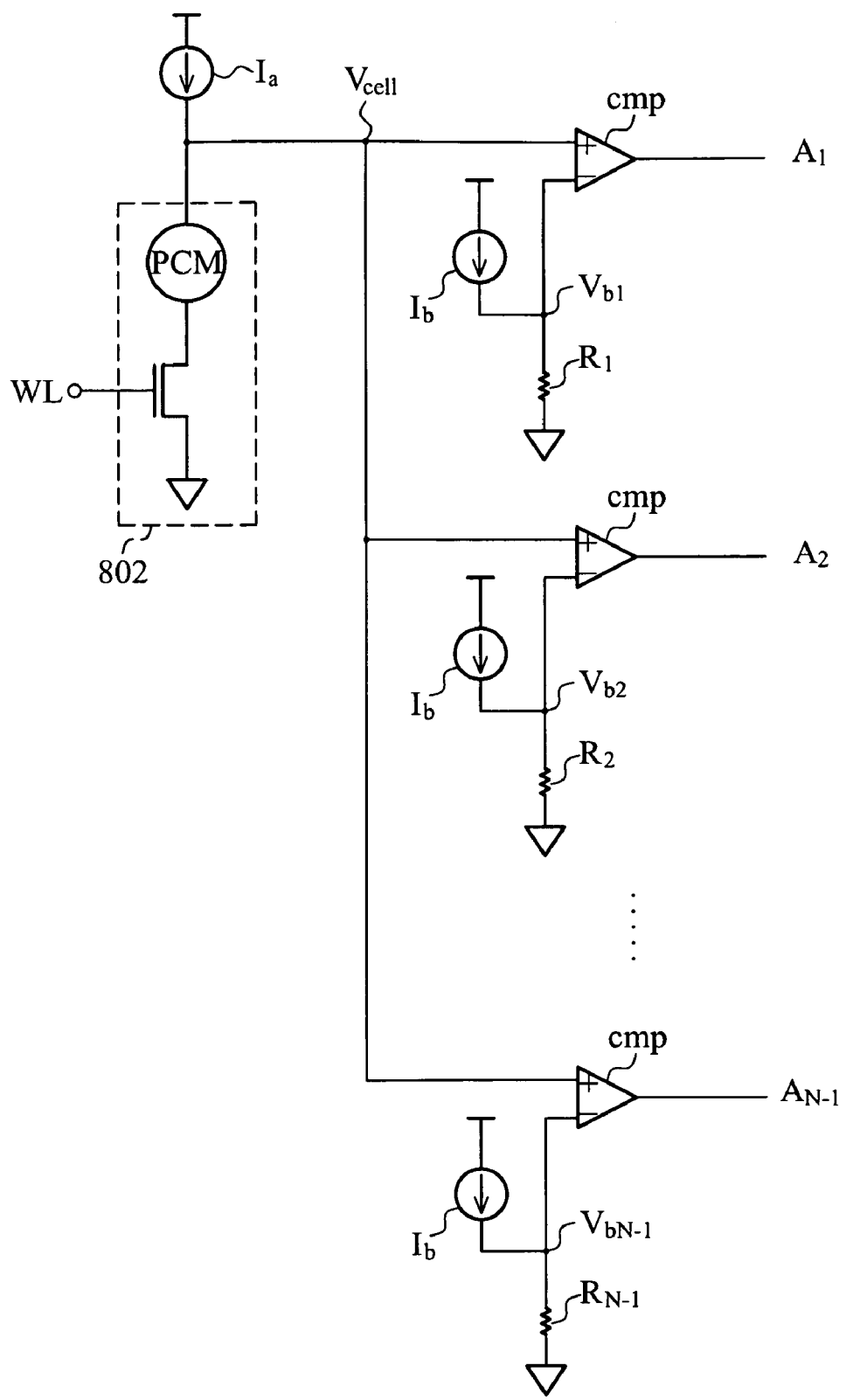
FIG. 8 depicts another exemplary embodiment of the resistance estimator of the invention.

FIG. 8 depicts another exemplary embodiment of the resistance estimator of the invention, which includes a first current generator $I_a$, a plurality of second current generators (all labeled as $I_b$), a plurality of resistors $R_1$-$R_{N-1}$, and a plurality of comparators (all labeled as cmp). The first current generator $I_a$ provides a first current to flow through the memory cell 802 to generate a memory cell voltage $V_{cell}$. The resistors $R_1$-$R_{N-1}$ are of distinct resistance and are coupled to the second current generators (all labeled as $I_b$), respectively, generating a plurality of boundary voltages $V_{b1}$-$V_{bN-1}$. The boundary voltages $V_{b1}$-$V_{bN-1}$ are coupled to the comparators (all labeled as cmp), respectively, to be compared with the memory cell voltage $V_{cell}$ to generate signals $(A_1, A_2 \ldots A_{N-1})$ to represent an estimated resistance level. Similarly, the estimated resistance level, represented by $(A_1, A_2 \ldots A_{N-1})$, may be coupled to the decoder shown in FIG. 7 to generate switch control signals $D_1$-$D_N$ controlling switches $S_1$-$S_N$ of FIG. 2, 3 or 5.

Figure 9:
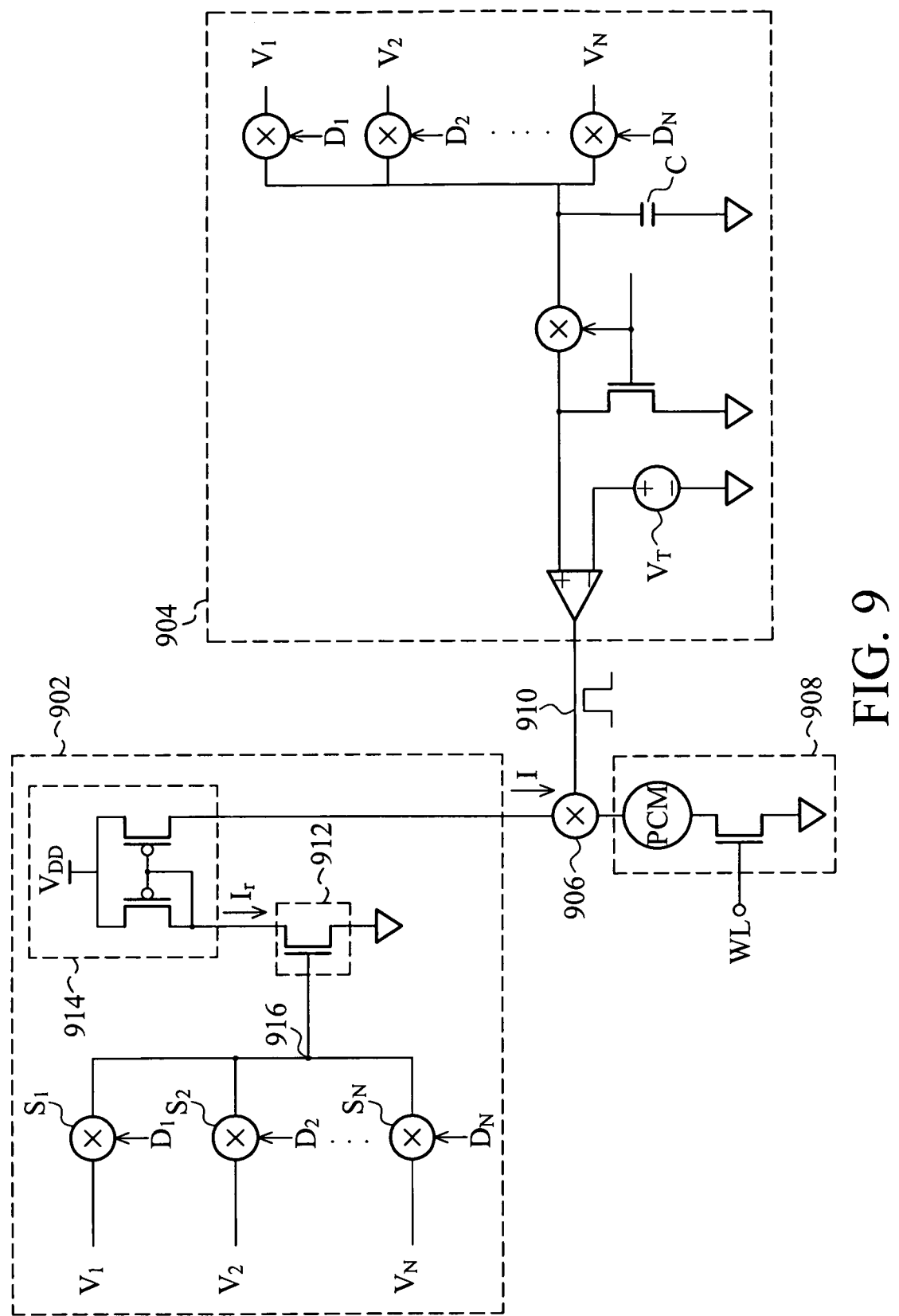
FIG. 9 depicts another exemplary embodiment of the write current generator of the invention.

In another exemplary embodiment of the invention, the write current generator (106 of FIG. 1) sets both the pulse width and the magnitude of the write current (110 of FIG. 1) according to the estimated resistance level (108 of FIG. 1). FIG. 9 depicts another exemplary embodiment of the write current generator of the invention, wherein the write current generator includes a magnitude controller 902, a pulse width controller 904 and a pulse width setting switch 906. The magnitude controller 902 outputs an action current I and sets the magnitude of the action current I according to the estimated resistance level (108 of FIG. 1). The pulse width controller 904 outputs a pulse signal 910 and sets the pulse width of the pulse signal 910 according to the estimated resistance level (108 of FIG. 1). The pulse width setting switch 906 is controlled by the pulse signal 910 for conducting the action current I to the memory cell 908.

Referring to the exemplary embodiment shown in FIG. 9, the magnitude controller 902 may include a plurality of voltage generators $V_1$-$V_N$, a plurality of switches $S_1$-$S_N$, a current generating element 912, a current mirror 914, and a decoder providing switch control signals $D_1$-$D_N$ for the switches $S_1$-$S_N$. The voltage generators $V_1$-$V_N$ provide voltage signals of distinct voltage levels. The current generator 912 has a control terminal 916. According to the voltage signal coupled to the control terminal 916, the current generating element 912 generates a reference current $I_r$. The current mirror 914 is coupled to the current generating element 912 to output the action current I according to the reference current $I_r$. The switches $S_1$-$S_N$ have a one-to-one relationship with the voltage generators $V_1$-$V_N$, and are operable to couple one of the voltage generators $V_1$-$V_N$ to the control terminal 916. According to the estimated resistance level (signal 108 of FIG. 1), the decoder outputs the switch control signals $D_1$-$D_N$ to conduct an appropriate switch (one of the switches $S_1$-$S_N$) to couple an appropriate voltage generator (one of $V_1$-$V_N$) to the control terminal 916 so as to set the magnitude of the action current I. The magnitude of the action current I determines the magnitude of the write current that is sent into the memory cell 908.

The pulse width controller 904 is realized by the circuit of FIG. 3. The pulse width controller 904 generates a pulse signal 910 to control the pulse width setting switch 906. Thus, the action time that controls the action current I to flow through the memory cell 908 is determined. The pulse width controller 904 may be replaced by other circuits such as that shown in FIG. 5 or any circuit having the same pulse width control function.

In another exemplary embodiment of the invention, the write current generator may only include the magnitude controller 902 without the pulse width controller 904 and the pulse width setting switch 906. In this case, the write current generator adjusts the resistance of the memory cell just by controlling the magnitude of the write current.

Figure 10:
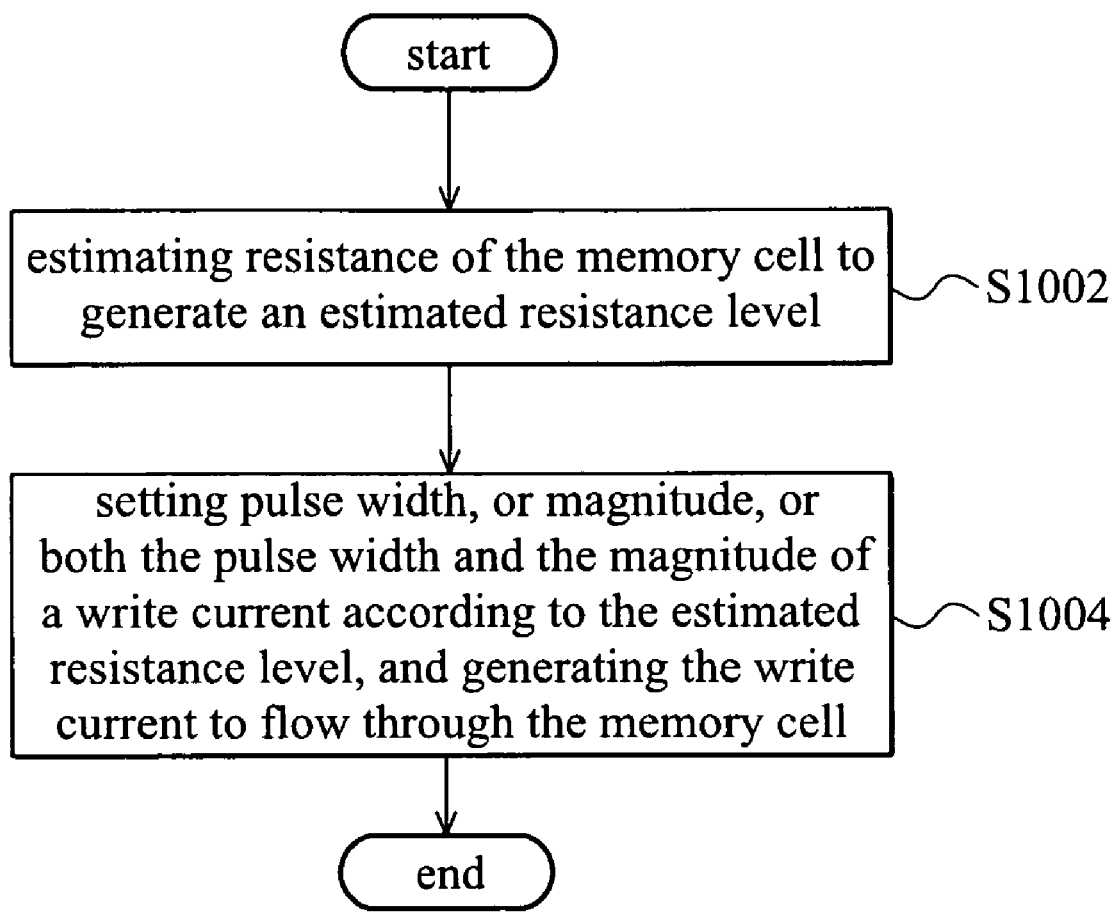
FIG. 10 depicts a flow chart of an exemplary embodiment of the writing methods of the invention.

The invention further discloses writing methods of memories. FIG. 10 depicts a flow chart of an exemplary embodiment of the memory writing methods of the invention. In step S1002, the resistance of a memory cell is estimated and an estimated resistance level is generated. In step S1004, a write current is generated to flow through the memory cell to change the resistance of the memory cell, wherein the write current is in a pulse form, and the pulse width, or the magnitude, or both the pulse width and magnitude of the write current is/are determined according to the estimated resistance level.

Figure 11:
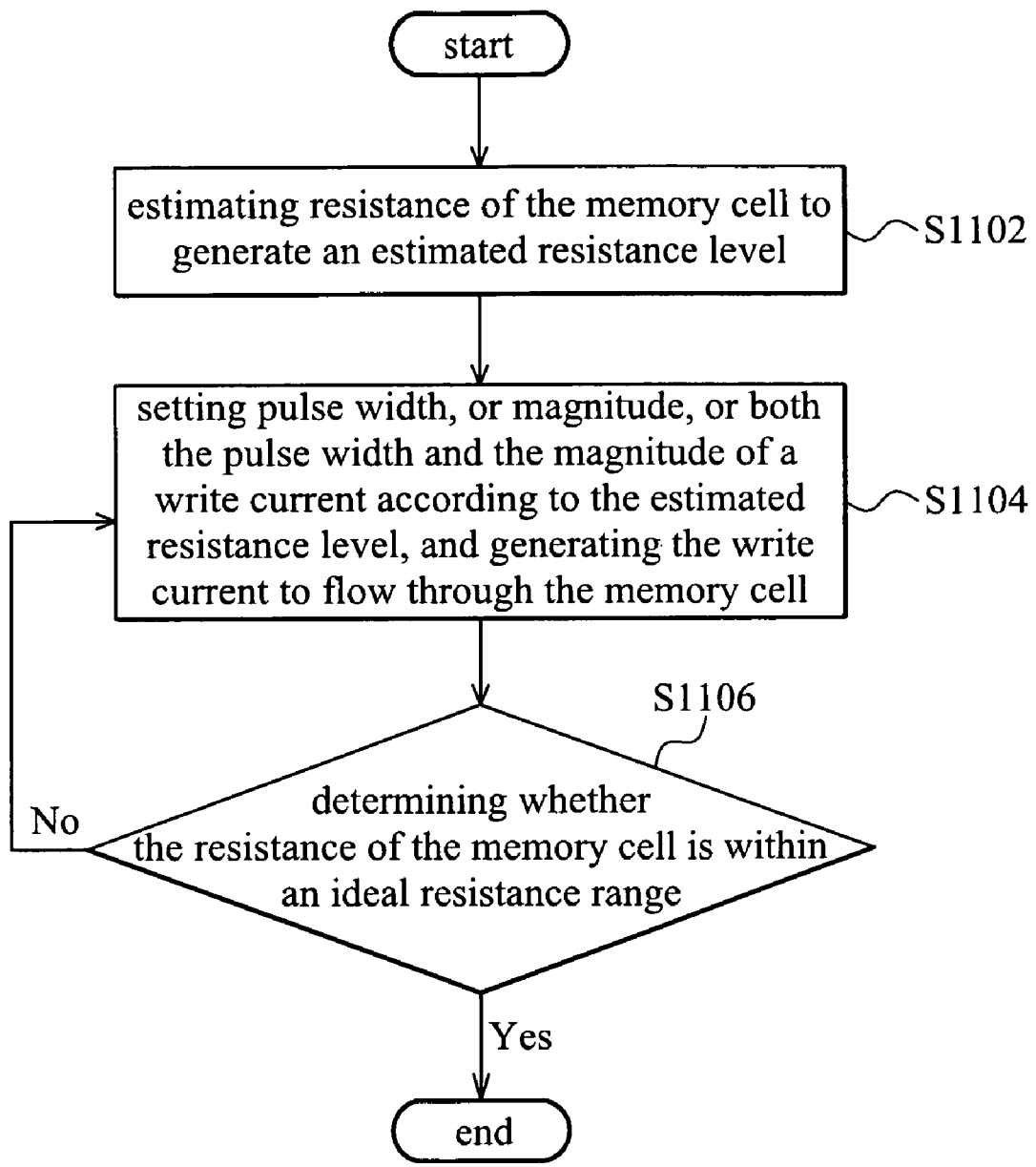
FIG. 11 depicts another exemplary embodiment of the writing methods of the invention.

FIG. 11 depicts another exemplary embodiment of the writing methods of the invention. In step S1102, a resistance level of a memory cell is estimated and an estimated resistance level is generated. In step S1104, a write current is generated to flow through the memory cell to change the resistance of the memory cell, wherein the write current is in a pulse form, and the pulse width, or the magnitude, or both the pulse width and magnitude of the write current is/are determined according to the estimated resistance level. After the write current effects a resistance change on the memory cell, the write memory method performs step S1106 to determine whether the resistance of the memory cell is within an ideal resistance range. When the resistance of the memory cell is within the ideal resistance range, the writing procedure ends. When the resistance of the memory cell is not within the ideal resistance range, the write memory method returns to step S1104.

The memory adopting the writing method shown in FIG. 11 may include more than one resistance estimator and more than one write current generator. The resistance estimators may have different resistance resolutions. For different stages of resistance estimation, different resistance estimators may be adopted. For example, resistance estimation from coarse to fine. Similarly, the write current generators may be designed to provide coarse-to-fine write current adjustments for the multiple write current adjusting stages.

The memory cell of the invention is not limited to the phase change techniques. The memory cell of the invention can be realized by any component with current-controlled resistance. Compared with the technique of US Patent Publication No. US2005/0068804A1, which is limited only to amorphous transformation of PCM cell, the invention achieves complete amorphous or crystalline transformation of PCM cell.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory, comprising:
    a memory cell;
    a resistance estimator, estimating resistance of the memory cell and outputting an estimated resistance level; and
    a write current generator, generating a write current to flow through the memory cell, wherein the write current is in a pulse form and the write current generator sets pulse width of the write current according to the estimated resistance level.

2. The memory as claimed in claim 1, wherein the write current generator comprises:
    a write current output terminal, outputting the write current;
    a plurality of current generators, generating a plurality of current pulses, respectively, wherein the current pulses have distinct pulse widths;
    a plurality of switches, controlled by a plurality of switch control signals, selectively coupling the current generators to the write current output terminal; and
    a decoder, generating the switch control signals according to the estimated resistance level.

3. The memory as claimed in claim 1, wherein the write current generator further comprises:
    a plurality of voltage generators, generating a plurality of voltage signals, respectively, wherein the voltages signals are of distinct voltage levels;
    a capacitor, coupled between a first node and ground;
    a plurality of switches, controlled by a plurality of switch control signals, selectively coupling one of the voltage generators to the first node;
    a decoder, generating the switch control signals when the write current generator is in a charge mode, wherein the switch control signals are generated according to the estimated resistance level and the switches conducted for different estimated resistance levels are different;
    a discharging element, coupled between a second node and the ground;
    a discharging switch, coupled between the first and second nodes, and turned on when the write current generator is in a discharge mode; and
    a comparator, comparing voltage of the second node with a reference voltage level and outputting a pulse signal for setting the pulse width of the write current.

4. The memory as claimed in claim 3, wherein the discharging element is a transistor and is turned on when the write current generator is in the discharge mode.

5. The memory as claimed in claim 3, wherein the discharging element comprises a current mirror and a resistor, wherein the current mirror is coupled to the second node via the resistor to provide a discharging current to pull down the voltage of the second node.

6. The memory as claimed in claim 1, wherein the write current generator further sets magnitude of the write current according to the estimated resistance level.

7. The memory as claimed in claim 1, wherein the resistance estimator comprises:
    a first current generator, providing a first current to flow through the memory cell to generate a memory cell voltage;
    a second current source, providing a second current;
    a plurality of resistors, having distinct resistance;
    a plurality of switches, selectively coupling the second current to the resistors; and
    a control unit, selectively conducting the switches;
    a comparator, comparing the memory cell voltage with a plurality of boundary voltages to generate a plurality of compared results, wherein the boundary voltages are separately generated when the switches are separately conducted to conduct the second current to flow through the coupled resistor; and
    a latch, latching the compared results, and being triggered by a trigger signal to output the compared results as the estimated resistance level.

8. The memory as claimed in claim 1, wherein the resistance estimator comprises:
    a first current generator, providing a first current to flow through the memory cell to generate a memory cell voltage;
    a plurality of resistors, having distinct resistance;
    a plurality of second current sources, coupled to the resistors, respectively, generating a plurality of boundary voltages; and
    a plurality of comparators, comparing the memory cell voltage with the boundary voltages, respectively,
    wherein the compared results generated by the comparators represent the estimated resistance level.

9. The memory as claimed in claim 6, wherein the write current generator comprises:
    a magnitude controller, outputting an action current and determining magnitude of the action current according to the estimated resistance level;
    a pulse width controller, generating a pulse signal and setting pulse width of the pulse signal according to the estimated resistance level;
    a pulse width setting switch, coupled between the magnitude controller and the memory cell and controlled by the pulse signal generated by the pulse width controller.

10. The memory as claimed in claim 9, wherein the magnitude controller comprises:
    a plurality of voltage generators, providing a plurality of voltage signals, respectively, wherein the voltage signals are of distinct voltage levels;
    a current generating element, having a control terminal and generating a reference current according to a voltage level of the control terminal;
    a plurality of switches, controlled by a plurality of switch control signals, respectively, selectively coupling one of the voltage generators to the control terminal of the current generating element;
    a decoder, generating the switch control signals according to the estimated resistance level to conduct different switches for different estimated resistance levels; and
    a current mirror, coupled to the current generating element to generate the action current according to the reference current.

11. The memory as claimed in claim 9, wherein the pulse width controller comprises:
    a plurality of voltage generators, generating a plurality of voltage signals, respectively, wherein the voltages signals are of distinct voltage levels;
    a capacitor, coupled between a first node and ground;
    a plurality of switches, controlled by a plurality of switch control signals, selectively coupling one of the voltage generators to the first node;
    a decoder, generating the switch control signals when the write current generator is in a charge mode, wherein the switch control signals are generated according to the estimated resistance level and the switches conducted for different estimated resistance levels are different;

a discharging element, coupled between a second node and the ground;

a discharging switch, coupled between the first and second nodes and being turned on when the write current generator is in a discharge mode; and a comparator, comparing voltage of the second node with a reference voltage level and outputting the pulse signal.

12. The memory as claimed in claim 11, wherein the discharging element is a transistor and is turned on when the pulse width controller is in the discharge mode.

13. The memory as claimed in claim 11, wherein the discharging element comprises a current mirror and a resistor, wherein the current mirror is coupled to the second node via the resistor to provide a discharging current to pull down the voltage of the second node.

14. A writing method for writing a memory, comprising:
estimating resistance of a memory cell of the memory and outputting an estimated resistance level;
setting pulse width, or both the pulse width and magnitude of a write current according to the estimated resistance level; and
generating the write current to flow through the memory cell to change the resistance of the memory cell.

15. The writing method as claimed in claim 14, further comprising:
determining whether the resistance of the memory cell is within an ideal resistance range;
stopping the write current to the memory cell from being sent when the resistance of the memory cell is within the ideal resistance range; and
returning to the steps of setting and generating the write current and sending the regenerated write current to the memory cell when the memory cell is not within the ideal resistance range.

16. The writing method as claimed in claim 14, wherein the memory cell is realized by a phase change memory cell.

17. The writing method as claimed in claim 16, applied in an amorphous state setting or crystalline state setting.

* * * * *